United States Patent [19]

Flowers

[11] 4,200,463
[45] Apr. 29, 1980

[54] SEMICONDUCTOR DEVICE MANUFACTURE USING PHOTORESIST PROTECTIVE COATING

[75] Inventor: Dervin L. Flowers, Scottsdale, Ariz.

[73] Assignee: Motorola, Inc., Schaumburg, Ill.

[21] Appl. No.: 642,425

[22] Filed: Dec. 19, 1975

[51] Int. Cl.$^2$ .............................................. G03C 5/00
[52] U.S. Cl. .................... 430/317; 430/327; 430/524; 430/531
[58] Field of Search .................. 96/36.2, 36, 35.1, 75, 96/86 P, 50 PL, 115 P, 115 R, 67

[56] References Cited

U.S. PATENT DOCUMENTS

| | | | |
|---|---|---|---|
| 2,430,585 | 11/1947 | Russell et al. | 96/50 PL |
| 2,588,765 | 3/1952 | Robijns | 96/50 PL |
| 2,798,004 | 7/1957 | Weigel | 96/50 PL |
| 3,046,131 | 7/1962 | Schmidt et al. | 96/75 |
| 3,317,320 | 5/1967 | Rebev | 96/36.2 |
| 3,404,004 | 10/1958 | Ake | 96/50 PL |
| 3,458,311 | 7/1969 | Alles | 96/115 P |
| 3,652,273 | 3/1972 | Htoo | 96/36 |
| 3,762,928 | 10/1973 | Willems | 96/50 PL |
| 3,843,368 | 10/1974 | Yamamoto et al. | 96/50 PL |
| 3,906,133 | 9/1975 | Flutie | 96/36.2 |

*Primary Examiner*—Charles L. Bowers, Jr.
*Attorney, Agent, or Firm*—Lowell E. Clark

[57] ABSTRACT

A protective coating composition for photoresist layers comprising an aqueous solution of a vinyl alcohol polymer, at least one surfactant having wetting properties and at least one surfactant having lubricant properties is disclosed. An improved process for forming a photoresist pattern employing this protective coating composition is also disclosed. The composition and process are particularly useful in the fabrication of semiconductor devices.

5 Claims, 4 Drawing Figures

SEMICONDUCTOR DEVICE MANUFACTURE USING PHOTORESIST PROTECTIVE COATING

BACKGROUND OF THE INVENTION

Photoresists are light sensitive materials which are applied to a wide variety of substrates. They provide a chemically resistant pattern after exposure through a mask to light of suitable wave length and development. For example, they are used in the fabrication of semiconductor devices by applying a thin layer of photoresist to a wafer, contacting the desired mask with the layer, exposing and developing to provide a predetermined pattern on the wafer. However, there are disadvantages accompanying the use of photoresists in semiconductor manufacturing. For example, mask deterioration occurs due to adhesion of photoresisted wafers to the mask upon contact with the photoresist layer. This in turn substantially reduces the life of the mask. Furthermore, pieces of photoresist from previous wafers adhering to the mask frequently cause latent pinholes in negative photoresist to be printed in the photoresist pattern when the mask is reused. These pinholes not only decrease the yield of devices made from the wafers, but detract from the quality of the resulting devices. Thus, the pinholes left in the photoresist are etched in later processing to form potential electrical defects in semiconductor devices. For example, interlayer shorts in multilayer devices and "popcorn" noise due to unwanted junction formation in semiconductor doping and diffusion operations have been traced to pinholes in the photoresist.

Some of the aforementioned problems have been recognized and attempts made to overcome them by prior art researchers. For example, U.S. Pat. No. 3,652,273 describes the use of a polyvinyl butyral polymer as a protective top coat for photoresist layers. U.S. Pat. No. 3,458,311 teaches a protective coating containing polyvinyl alcohol and a surfactant having wetting properties; the coating is used for making printing plates.

SUMMARY OF THE INVENTION

It is an object of this invention to provide an improved protective coating for photoresist layers.

It is another object of this invention to provide an improved photoresist protective coating for use in semiconductor processing which provides improved yields and properties of semiconductor devices.

It is still another object of this invention to provide an improved process for forming patterned photoresist layers on substrates.

In accordance with this invention, a protective coating composition for photoresist layers is provided which comprises an aqueous solution of a water-soluble, film-forming polymer, at least one surfactant having wetting properties and at least one surfactant having lubricant properties. According to the method of this invention, a photoresist layer is coated with this protective coating prior to exposing the layer to a light pattern. The coating is then removed and the exposed portions of the photoresist developed to provide the desired pattern.

DETAILED DESCRIPTION OF THE INVENTION

Figure 1:
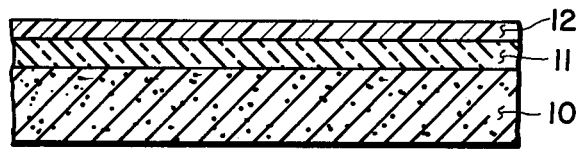
FIGS. 1-4 are cross-sectional, diagrammatic views of a section of a silicon wafer being patterned in accordance with this invention.
Figure 2:
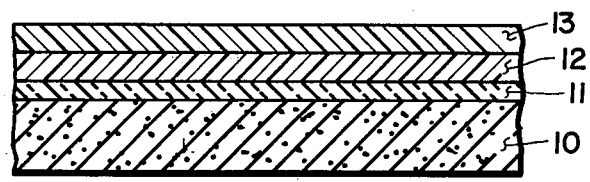
Figure 3:
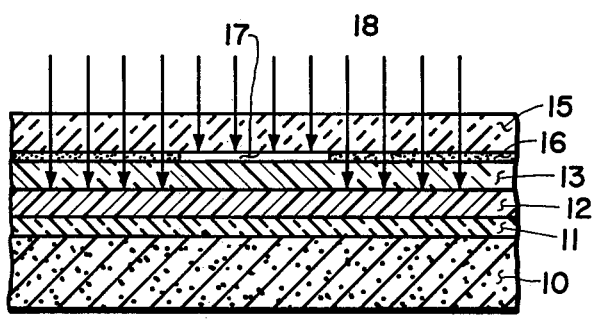

Referring to the drawings, in FIG. 1 a silicon dioxide layer 11 is formed on a silicon wafer surface 10 by heating the wafer in an oxidizing atmosphere in a conventional manner. A coating 12, of a photoresist composition, is then applied over the silicon dioxide layer 11. In FIG. 2, a protective coating composition according to this invention is applied as a coating 13 over the photoresist layer 12. Then the surface of coating 13 is contacted by a conventional photographic mask 14 as depicted in FIG. 3. Mask 14 consists of a transparent base 15 and a transparent fixed photographic emulsion 16 having an opaque image 17 formed therein. According to standard photolithographic techniques, the photoresist is then exposed to light indicated by arrows 18 which passes through the unmasked areas of mask 14 and coating 13.

Figure 4:
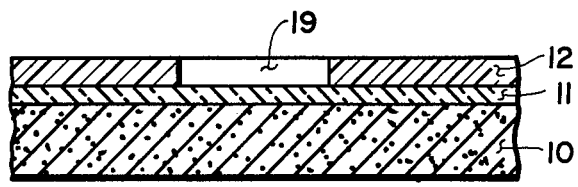

Then coating 13 is removed from the exposed wafer by soaking the wafer in water or water containing a small amount of surfactant. After drying, the exposed wafer is developed with an appropriate organic solvent in order to remove the unexposed parts of the photoresist layer 16, leaving a photoresist pattern indicated by opening 19 in FIG. 4 which corresponds to the mask or unexposed areas.

More in detail, the protective coating composition of this invention comprises 0.3 to 3.0% by weight of a water-soluble, film-forming polymer, 0.005 to 0.3% by weight of a surfactant having wetting properties, 0.005 to 0.1% by weight of surfactant having lubricant properties, the balance being water or water and an organic solvent.

The polymer employed in the composition of this invention is a homopolymer of vinyl alcohol, 2-methyl-5-vinyl pyrollidone, or N-methyl pyrollidone or a copolymer comprising a major proportion of one of the aforementioned monomers. Suitable homopolymers generally have a number average molecular weight from about 1000 to 50,000. Exemplary copolymers comprise the major monomer and up to 20% by weight hydroxyethyl methacrylate, the major monomer and up to 50% by weight glycidyl methacrylate, the major monomer and up to 99% by weight allyl alcohol, the major monomer and up to 40% by weight vinyl sulfonate, the major monomer and up to 10% by weight vinyl chloride, etc. The homopolymers are readily made according to standard free radical catalysis polymerization techniques. Homopolymers and copolymers of vinyl alcohol are preferred.

By the term "surfactant having wetting properties" in the claims and specification herein is meant a substance that lowers the surface tension between two materials. Useful wetting surfactants include nonionic materials, for example polyhydric alcohols such as glycerine, diethylene glycol, triethylene glycol, polyethylene glycols, various ethylene oxide derivatives such as polyoxyethylenated alkyl phenols, etc.; anionic materials, for example esters of organic acids such as dioctyl sodium sulfosuccinate, detergents such as dodecyl benzene sulfonate, sodium lauryl sulfonate, etc.; cationic materials such as polyethoxylated amines, e.g. those having the formula

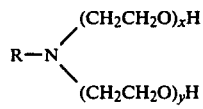

wherein R is an alkyl group of 12 to 24 carbon atoms, such as lauryl, stearyl, tetracosanyl, etc., x is 1 or 2 and y is an integer from 3 to 9, quaternary ammonium compounds such as trialkyl ammonium halides, e.g., trimethyl octadecyl ammonium chloride, etc. Mixtures of the aforementioned surfactants, including mixtures of different types of surfactants, can also be employed.

While any of the aforementioned surfactants having wetting properties can be employed, it is preferred to utilize the nonionic materials, and particularly the polyoxyethenated alkyl phenols.

By the term "surfactant having lubricant properties" in the claims and specification herein is meant a substance that prevents welding of asperities and hence wear of materials in sliding or pressure contact with each other.

Useful lubricant surfactants include acids, amides, alcohols and thiols containing a long chain alkyl group, i.e., a 10 to 24 carbon atoms chain. Exemplificative compounds include stearyl alcohol, glyceryl monostearate, stearamide, tertiary alkyl amides such as 9,9-dimethyl decylamide, etc. Micelle forming lubricants, for example the heavy metal salts of long chain alkyl (10 to 24 carbon atoms) fatty acids, aromatic acids or phenols can also be employed. Typical heavy metals include barium, calcium, strontium, magnesium, zinc, manganese, cadmium, etc. Fatty acids include saturated acids such as decanoic, dodecanoic, and octadecanoic acids, and unsaturated acids such as oleic and linoleic acid. Aromatic acids and phenols include 3,5-di-tert butyl phenol and 3-octyl, 4-methyl salicylic acid.

Preferred lubricant surfactants include long chain alkyl alcohols such as glyceryl monostearate and the heavy metal salts of saturated fatty acids.

The coating composition is made by mixing the above-mentioned ingredients in the appropriate amount. While water alone can be used as a solvent, it is preferred to include minor amounts of organic solvents. For example, mixture of water with alcohols such as ethanol, propanol, butanol, etc., methyl ethyl ketone, tetrahydrofuran, etc. can be used. Thus, the term "aqueous solution" in the claims and specification includes solutions in water alone and in water containing a minor proportion of an organic solvent. The composition is then applied to the photoresist layer by any suitable means such as spinning, spraying, etc. Generally, the layer of protective coating is very thin, being from 100 to 1000 A°. It is readily removable by immersion or washing with water for several minutes.

It has been found that the speed and efficiency of removal of the protective coating is vastly improved if small amounts of one of the previously described wetting surfactants is added to the water. Furthermore, where negative photoresists are employed, an alcohol rinse after coating removal facilitates drying and inhibits "film" or "scum" formation sometimes seen in the developed areas of the photoresist due to moisture.

It should be noted that although the drawing depict a process utilizing a negative photoresist, any appropriate positive or negative photoresist can be employed in the process of this invention. These photoresists generally comprise a polymer, a sensitizer and a solvent.

One group of commercially available negative photoresists is based on polyvinyl cinnamates. Another group contains a mixture of partially cyclized polymer of cis-1,4-isoprene. Natural rubber resin based compositions and cinnamylidene or poly-β-styril acrylic ester compositions are also exemplary. Typical sensitizers for these compositions are the azides, such as 2,6-bis (p-azidobenzylidene)-4-methylcyclohexanone. When the aforementioned photoresist compositions are exposed to actinic radiation, the sensitizer initiates a reaction causing cross-linking throughout the polymer. Typical commercially available negative photoresists are Hunt Chemical Company's Waycoat IC, Waycoat SC and Waycoat HR; and Eastman Kodak's KPR, KTFR, KMER, and Kodak 747.

Exemplary positive photoresists are based on m-cresol formaldehyde novolak resins and contain a diazo oxide sensitizer such as 1-oxo-diazo-5-sulfonate ester of naphthalene. Upon exposure to light the sensitizer decomposes, forming a ketene which can be hydrolyzed to form a carboxylic acid, rendering the composition water-soluble. Typical positive photoresists are the Shipley AZ series and the GAF Photoresists.

Furthermore types of masks other than the one depicted in the drawings cause the problems which this invention overcomes. Thus, the process is applicable where such masks as chrome and iron oxide on glass are used.

While any composition comprising ingredients within the ranges defined herein can be employed in the practice of this invention, preferred compositions comprise 0.5 to 1.5% by weight polyvinyl alcohol, 0.05 to 0.15% by weight of a surfactant having wetting properties, and 0.005 to 0.02% by weight of a non-metallic lubricant surfactant or 0.02 to 0.1% by weight of a metallic lubricant.

The following examples will serve to illustrate the practice of this invention.

EXAMPLE 1

A. Preparation of coating composition

The amount of 16.2 g. of polyvinyl alcohol (99–100% hydrolised, viscosity of 4.0% by weight water solution 5.5 cps) was dissolved in 2700 ml of distilled water at 45°±5° C. with stirring. To this solution was added 300 ml of isopropyl alcohol containing 0.3 g. of glyceryl monostearate and 1.5 g. of Triton X-100, a polyoxyethylenated tert alkyl (phenol) having 6–9 repeating oxyethylene units and sold by Rohm and Haas, Philadelphia, Pa. The solution was mixed well, cooled and filtered under 15–20 psi $N_2$ pressure.

B. Use of coating composition

Sixteen first metal patterned silicon wafers delineated by 133×145 mil die were passivated with 10,000 A° layers of phosphorous doped silicon dioxide. After baking for 30 minutes at 200° C., the wafers were cooled. Then an isoprene based negative photo-resist composition sold as HR 100 by the Hunt Chemical Company was spun at 5000 rpm over the silicon dioxide layer and the wafers baked in a nitrogen ambient at 80° for 15 minutes. A control group of four wafers was withheld and the composition described in paragraph A was then spun on the remaining wafers at 3,000 rpm, and baked at 80° C. for 15 minutes, thereby drying to a thickness of about 500 A°. The surface of both groups of wafers were then contacted with conventional photographic masks consisting of the transparent base coated with a photographic emulsion. Two contacts were made on each wafer in order to simulate actual semiconductor processing conditions. The photoresist was exposed to light. Then those wafers containing the protective coating of this invention were immersed for five minutes in distilled water containing 0.1% of the previously described Triton X-100 surfactant followed by a five minute rinse of distilled water, dipped in isopropyl alcohol and spun dry. This treatment removed the protective coating. Next, all the wafers were processed conventionally, that is, the exposed photoresist was developed, baked and etched with a 1:1 ammonium fluoride-acetic acid mixture at 22° C. for 3 minutes. Further conventional processing provided capacitors on the wafers.

Then the backs of the wafers were forward biased, that is, forward biased collector-substrate, and capacitor measurements made at 30 volts. The average capacitance yield, that is, the percent of capacitors that did not breakdown at 30 volts, is set forth in the table. It will be apparent that a surprising increase in capacitor yield is realized employing the protective coating composition of this invention.

COMPARATIVE EXAMPLES

For purposes of comparison, three batches comprising blank wafers each were treated as described in example one with the following exceptions:

In Comparative Example 1, the protective coating comprised only polyvinyl alcohol.

In Comparative Example 2, the coating comprises polyvinyl alcohol and Triton X-100 in the same percentages by weight as indicated in Example 1.

In Comparative Example 3, the protective coating comprised only polyvinyl alcohol and glycerol monostearate, the individual components being employed in the same percentages by weight as in Example 1. The capacitor yield for devices made from these wafers are also indicated in Table 1.

TABLE 1

| EXAMPLE | CAPACITOR YIELD |
|---------|-----------------|
| Control | 38 |
| 1 | 75 |
| C-1 | 50 |
| C-2 | 52 |
| C-3 | 57 |

EXAMPLES 2–5

Following the procedure of Example 1, coating compositions were made and used on silicon wafers; the ingredients of the compositions and the capacitor yields of the devices made from the wafers are set forth in the Table 2. The percentages of the ingredients are by weight; all compositions were prepared in a 90% by weight/10% by volume water/isopropanol solution.

The number average molecular weights ($\overline{M}_n$) of the polyvinyl alcohols (PVA) were estimated.

TABLE 2

| EXAMPLE | PVA | Wetting Surfactant | Lubricating Surfactant | Capacitor Yield |
|---------|-----|--------------------|------------------------|-----------------|
| Control | — | — | — | 36% |
| 2 | 0.6% ($\mu$ 4–6 cps; $\overline{M}_n$ 2000) | 0.1% Aerosolot[1] | 0.01% GMS[2] | 73% |
| 3 | 0.4% ($\mu$ 28–32 cps; $\overline{M}_n$ 6000) | 0.05% Triton X-100[3] | 0.1% Calcium stearate | 76% |
| 4 | 0.3% ($\mu$ 55–65 cps; $\overline{M}_n$ 14,000) | 0.01% Triton X-100[3] | 0.02% DAA[4] | 78% |
| 5 | 1.0% ($\mu$ 4–6 cps; $\overline{M}_n$ 2000) | 0.05% SN[5] | 0.005% GMS[2] | — |

[1] Dioctyl sodium sulfosuccinate as marketed by American Cyanamid Co.
[2] Glyceryl monostearate
[3] Polyoxyethylenated tert-alkyl phenol containing 9–10 oxyethylene units as marketed by Rohm and Haas Co.
[4] Dodecanoic acid amide

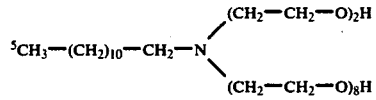

[5] $CH_3-(CH_2)_{10}-CH_2-N \begin{matrix} (CH_2-CH_2-O)_2H \\ (CH_2-CH_2-O)_8H \end{matrix}$

What is claimed is:

1. In the method for forming a photoresist pattern on a semiconductor substrate by coating the substrate with a layer of photoresist, exposing the layer to a light pattern and developing the exposed layer by treating it with a solvent, the improvement which comprises:
    coating the photoresist layer prior to exposure with a protective coating composition comprising a water-soluble, film-forming polyvinyl alcohol, a surfactant having wetting properties in an amount sufficient to reduce the surface tension of the composition and a surfactant having lubricant properties in an amount sufficient to reduce wear on materials in contact there with.

2. The method of claim 1 wherein said coating composition comprises an aqueous solution containing:
    0.3 to 3.0% by weight of said polyvinyl alcohol;
    0.005 to 0.3% by weight of said surfactant having wetting properties; and
    0.005 to 0.1% by weight of said surfactant having lubricant properties.

3. The method of claim 2 wherein said coating composition comprises:
    0.5 to 1.5% by weight of said vinyl alcohol;
    0.05 to 0.15% by weight of said surfactant having wetting properties; and
    0.005 to 0.02% by weight of said surfactant having lubricant properties where said lubricant surfactant is non-metallic or 0.02 to 0.1% by weight of said surfactant having lubricant properties where said surfactant is metallic.

4. The method of claim 1 further including the step of removing said protective coating composition prior to developing the exposed layer.

5. The method of claim 4 wherein said substrate is silicon.